(12) United States Patent
Losehand et al.

(10) Patent No.: US 7,453,509 B2
(45) Date of Patent: Nov. 18, 2008

(54) DIGITAL CAMERA WITH A TRANSPARENT CORE DISPOSED BETWEEN A LENS AND A LIGHT-SENSITIVE SENSOR

(75) Inventors: Reinhard Losehand, München (DE); Stefan Paulus, Zeitlarn (DE); Martin Petz, Eglhausen (DE); Josef-Paul Schaffer, München (DE); Martin Schroeder, Donaustauf (DE); Bernd Stadler, Donaustauf (DE)

(73) Assignee: Infineon Technologies AG, Munich (DE)

( * ) Notice: Subject to any disclaimer, the term of this patent is extended or adjusted under 35 U.S.C. 154(b) by 1078 days.

(21) Appl. No.: 10/650,815

(22) Filed: Aug. 28, 2003

(65) Prior Publication Data
US 2004/0095502 A1  May 20, 2004

Related U.S. Application Data

(63) Continuation of application No. PCT/DE02/00708, filed on Feb. 28, 2002.

(30) Foreign Application Priority Data
Feb. 28, 2001  (DE)  ................. 101 09 787

(51) Int. Cl.
*H04N 5/225* (2006.01)
(52) U.S. Cl. ............... 348/340; 348/373; 348/374
(58) Field of Classification Search ......... 348/373, 348/340, 374
See application file for complete search history.

(56) References Cited

U.S. PATENT DOCUMENTS

| | | | | |
|---|---|---|---|---|
| 2,918,842 A * | 12/1959 | Smith | .......... | 359/478 |
| 4,024,397 A | 5/1977 | Weiner | | |
| 4,416,526 A * | 11/1983 | Tomori et al. | ........ | 396/80 |
| 5,040,868 A | 8/1991 | Waitl et al. | | |
| 5,266,501 A | 11/1993 | Imai | | |
| 5,274,456 A * | 12/1993 | Izumi et al. | ........ | 348/335 |
| 5,400,072 A * | 3/1995 | Izumi et al. | ........ | 348/335 |
| 5,493,143 A | 2/1996 | Hokari | | |
| 5,673,083 A * | 9/1997 | Izumi et al. | ........ | 348/340 |
| 5,950,017 A * | 9/1999 | Reff | ........... | 396/14 |
| 6,307,590 B1 * | 10/2001 | Yoshida | ........ | 348/340 |

(Continued)

FOREIGN PATENT DOCUMENTS

DE    198 42 828 A1    3/2000

(Continued)

OTHER PUBLICATIONS

Horne, D. F.: "Lens Mechanism Technology", J. W. Arrowsmith Ltd., Bristol, Oct. 1975, pp. 191-221.

*Primary Examiner*—David Ometz
*Assistant Examiner*—Usman Khan
(74) *Attorney, Agent, or Firm*—Laurence A. Greenberg; Werner H. Stemer; Ralph E. Locher

(57) ABSTRACT

A digital camera has a lens, a camera housing, and a semiconductor sensor. The camera housing is primarily formed of a transparent plastic block that encloses a semiconductor sensor only on its underside and has an adapted lens on its top side. Between the two there is provided an opaque layer with an aperture that improves the image quality. The invention also relates to a method for producing such a digital camera.

24 Claims, 8 Drawing Sheets

U.S. PATENT DOCUMENTS

| | | | |
|---|---|---|---|
| 6,762,796 B1 * | 7/2004 | Nakajoh et al. | 348/340 |
| 6,768,516 B2 * | 7/2004 | Yamada et al. | 348/340 |
| 6,813,099 B2 * | 11/2004 | Yamaguchi | 359/779 |
| 6,898,030 B1 * | 5/2005 | Lin et al. | 359/819 |
| 6,945,674 B2 * | 9/2005 | Yoneda et al. | 362/294 |
| 7,088,397 B1 * | 8/2006 | Hunter et al. | 348/374 |
| 7,133,076 B1 * | 11/2006 | Campbell | 348/340 |
| 7,391,458 B2 * | 6/2008 | Sakamoto | 348/340 |

FOREIGN PATENT DOCUMENTS

| | | |
|---|---|---|
| EP | 0 634 800 B1 | 1/1995 |
| EP | 0 840 502 A3 | 1/2000 |
| WO | 01/91193 A2 | 11/2001 |

\* cited by examiner

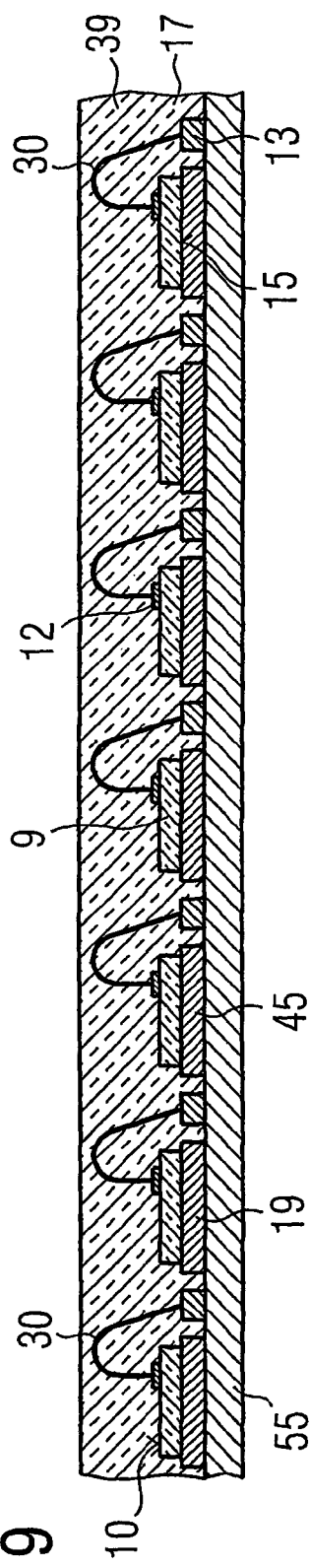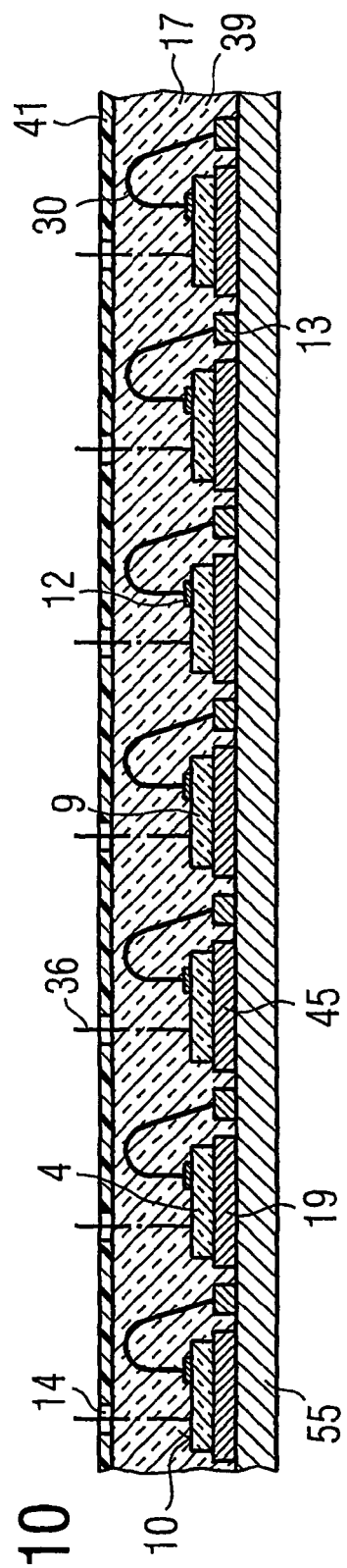

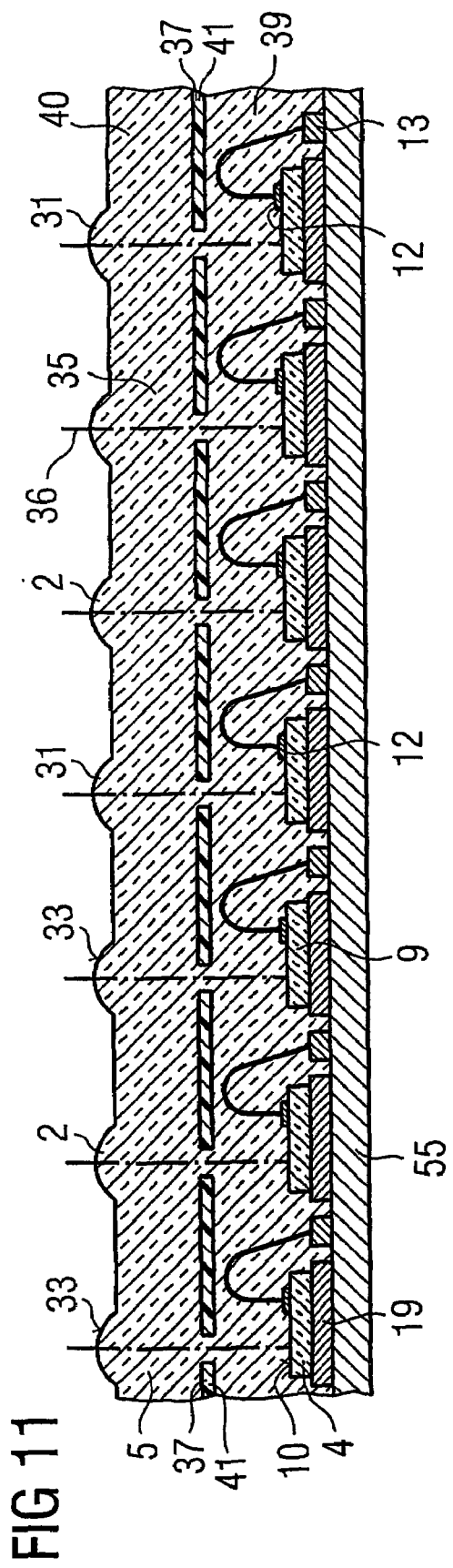

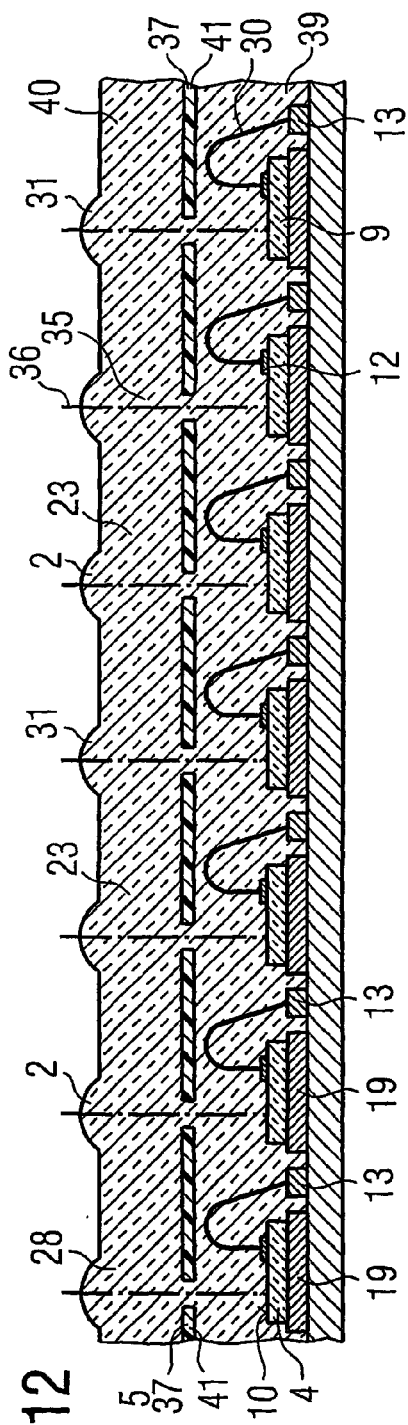

DIGITAL CAMERA WITH A TRANSPARENT CORE DISPOSED BETWEEN A LENS AND A LIGHT-SENSITIVE SENSOR

CROSS-REFERENCE TO RELATED APPLICATION

This application is a continuation of copending International Application No. PCT/DE02/00708, filed Feb. 28, 2002, which designated the United States and which was not published in English.

BACKGROUND OF THE INVENTION

Field of the Invention

The invention relates to a digital camera with a camera housing, a lens that has a lens top side and a lens underside, and with a light-sensitive sensor that has a top side, aligned with the lens, and an underside.

The advancing improvement and intensification of communications in the most varied networks is raising the requirement for visual transmissions from one subscriber to another subscriber in a communication network. Visual transmission requires digital cameras that resolve the received image into digital pixels that can then be transmitted over the network. Such cameras are currently expensive and still in part unattainable for the final consumer, that is to say for the PC user.

SUMMARY OF THE INVENTION

It is accordingly an object of the invention to provide a digital camera, which overcomes the above-mentioned disadvantages of the heretofore-known devices and methods of this general type and which provides for a digital camera that can be produced cost-effectively and supplies a useful resolution.

With the foregoing and other objects in view there is provided, in accordance with the invention, a digital camera, comprising:

a lens having a lens top side and a lens underside;
a camera housing;
a light-sensitive semiconductor sensor having a top side aligned with the lens and an underside;
the camera housing having a plastic body with a top side carrying the lens and an underside with the light-sensitive sensor;
a transparent plastic core filling an interspace between the lens underside and the top side of the semiconductor sensor; and
wherein a circular aperture is formed between the lens underside and the top side of the semiconductor sensor in the transparent plastic core.

According to the invention, the digital camera has a camera housing, a lens that has a lens top side and a lens underside, and a light-sensitive sensor that has a top side, aligned with the lens, and an underside. The digital camera is miniaturized to such an extent that a multiplicity of digital cameras can be produced from a plastic plate with a thickness of less than 5 mm.

The camera housing has a plastic body that bears the lens on its top side and has a semiconductor sensor as light-sensitive sensor on its underside. In this case, the camera has a transparent plastic core that fills up the interspace between the lens underside and the top side of the semiconductor sensor. A circular aperture is arranged between the lens underside and the top side of the semiconductor sensor in the transparent plastic core. This digital camera has the advantage that not only is its size minimized, but also the number of light-refracting transitions is virtually reduced to two surfaces. The first light-refracting transition is provided on the top side of the lens, and the second light-refracting transition is provided at the transition from the transparent plastic core to the semiconductor sensor. Further light-refracting transitions are avoided in this design according to the invention in order, on the one hand, to ensure a compact design of the digital camera and, on the other hand, to avoid multiple reflections and scattering mechanisms in the camera. Complicated and costly coatings of the lens surfaces and/or of the transitions are avoided by the limitation of the light-refracting transitions to only two transitions.

Moreover, color correction measures are dispensable owing to the further restriction to dimensions miniaturized in such a way that the height of the camera can be accommodated in a plastic plate that has a thickness of less than 5 mm. Because of the transparent plastic core, which has a refractive index corresponding to the refractive index of the plastic lens, the number of light-refractive surfaces is virtually reduced to the light-refractive surface of the lenses because of the filling up of the interspace between the lens and surface of the semiconductor sensor. For this purpose, the plastic core is completely enclosed by the plastic body of the camera housing such that, after refraction at the front side of the lens, the incident light beam is completely guided, until striking the top side of the semiconductor sensor, in transparent plastic with an identical refractive index to that of the lens.

The semiconductor sensor itself has on its top side a matrix of light-sensitive cells. The electrodes of these light-sensitive cells are connected to contact surfaces via integrated circuits. These integrated circuits permit there to be generated from the signals present in parallel at each pixel of the image a serially interrogatable signal that is conducted to external connections via a rewiring structure. In this case, the number of external connections is miniaturized to such an extent that it is necessary in principle to provide one signal connection and two supply connections for the digital camera. The number of connections can be raised straight away for particular applications. However, because of the miniaturized surface, only a very restricted region is available for electric connections to the underside of the camera.

In one embodiment of the invention, the plastic body is produced from light-absorbing plastic material and surrounds a frustoconical transparent plastic core at its center. The frustoconical shape results at the apex of the conical frustum in a constricted opening that simultaneously serves as aperture of the digital camera. The basic area of the conical frustum is greater than the area of the aperture which is formed by the apex of the conical frustum, and it is therefore advantageously possible to realize different digital cameras whose aperture angle can be adapted to the applications.

In a further embodiment of the invention, the optically transparent region is not restricted solely to the at least optically transparent core region of the camera, but the entire plastic body has optically transparent material. Such a camera design substantially simplifies the method of production for the camera, since a continuous optically transparent plastic plate can be used for constructing the camera.

The position of the aperture inside the camera housing is also decisive for optimally picking up the image in the camera. In a further embodiment of the invention, the distance between the lens top side and a corresponding aperture plate for the aperture is therefore between a half and a third of the distance between the lens top side and the top side of the semiconductor sensor. It is true that apertures above the lens, that is to say outside the camera housing according to the invention, are also conceivable in principle, but there is the risk of scattered light penetrating into the camera so that apertures arranged in such a way outside the camera system must be protected against scattered light by an additional tube, something which would render the production of the camera unnecessarily more expensive.

The implementation of the camera according to the invention is cost-effective because the production of a color camera requires the provision of only four cameras of the type according to the invention, specifically one camera for the black/white signal and three cameras for the three color components, and the color signals of the individual cameras and the black/white signal can be recombined to form an image via an appropriate logical and continuous evaluation.

A further embodiment of the invention provides that the rewiring structure is arranged on the underside of the plastic body. This arrangement of the rewiring structure on the underside of the plastic body is attended by the advantage that substantially more area is available than directly on the rear side of the semiconductor chip sensor. At the same time, the rewiring film can be incorporated into the opening for the semiconductor sensor on the underside of the plastic body in such a way that upon bonding the semiconductor sensor with its contact surfaces located on the top side into the prepared opening on the underside of the plastic body contact is simultaneously achieved with the rewiring structure on the underside of the plastic body.

A further embodiment of the invention provides that the rewiring structure is arranged on the underside of the semiconductor sensor. This embodiment of the invention has the advantage that the entire rewiring structure can be taken into account as early as when producing the semiconductor sensor, and complicated steps for producing a rewiring structure on the underside of the plastic body are thereby avoided. However, it is possible for this embodiment to be applied advantageously only as long as the size of the semiconductor sensor permits external connections to be fitted in a suitable step width for further processing in a communication device.

If larger structures of the external connections are required, it is possible in a further embodiment of the invention for the rewiring structure to be a lead frame on which the miniaturized semiconductor sensor is mounted. The size of such a lead frame with appropriate rewiring structures can be adapted to the required step widths for external contact connections in order to permit an appropriate tapping of the signal voltages and an appropriate connection of the supply voltage for the semiconductor sensor of the digital camera.

In a further embodiment of the invention, the lens is surrounded by a lightsafe mask (i.e., an opaque mask), which ensures that no scattered light can fall into the digital miniaturized camera. This lightsafe mask can be reduced in size so far that only a subregion of the lens is available for the imaging, such that the lightsafe mask virtually constitutes a further aperture, and the imaging quality is thereby improved.

In a further embodiment of the invention, it is provided that the rewiring structure has conductor tracks that connect the contact surfaces of the semiconductor sensor to external connections on the underside of the camera. The camera therefore has the advantage that it need only be plugged into a socket by the person applying or using it. This socket has on its underside appropriate plug-in contacts that communicate with the external connections on the underside of the camera. In this way, the user is afforded visual exchange of information in a communication network.

For this purpose, in a further embodiment of the invention, the external connections can have contact bumps. These contact bumps can be implemented in a relatively simple way and can therefore be used in an extremely cost-effective fashion.

A further embodiment of the invention provides that the digital camera has as rewiring structure a lead frame that bears the semiconductor sensor and has external electric connections, the contact surfaces of the semiconductor sensor being connected to the external connections via bonded connections. In this case, the bonded connections are arranged inside the plastic body of the camera and only the external connections remain accessible for electric tapping on the underside of the camera or to the side in the lower region of the camera. Because of the possibility of selection of lateral access to the external connections, or of access on the underside of the digital camera to the external connections, the embodiment of the invention with a lead frame is particularly advantageous.

A further embodiment of the invention provides that the digital camera has a plastic body that forms a common plastic body made from transparent plastic with the lens. This embodiment of the invention has the advantage that the lens can be molded directly onto the plastic body and that there is thus no need to provide any sort of optical transitions between a core region of the plastic body and a lens made from plastic. However, the entire digital camera now forms an internal block that is structured only by an aperture arranged between the lens region and the surface of the semiconductor sensor. Such a digital camera, which consists entirely except for an aperture plate for an aperture of a transparent plastic block, receives scattered light via the external surfaces, and this would result in image noise. It is advantageous for this reason to install such a camera in a light-tight fashion in a mount that can be provided in a housing of a portable telephone unit or in a housing of a computer or in a housing of a display screen etc.

In a further embodiment of the invention, the transparent plastic body of a digital camera is covered by a lightsafe or opaque film, while leaving free an opening for the lens. Such a lightsafe film can be produced from a transparent plastic provided with filler, and be shrunk as shrink film onto the transparent plastic body of the digital camera. This embodiment of the invention has the advantage that the camera is also functional without being installed in a light-tight mount.

In accordance with a further embodiment of the invention, the semiconductor sensor can be mounted on a lead frame with the aid of an adhesive such as a conductive adhesive. In a further embodiment of the invention, the semiconductor sensor can be mounted on the underside of the plastic body with the aid of an adhesive, use being made in both cases of an optically transparent plastic in order not to impair the sensor surface of the semiconductor sensor. The lens too can be mounted with the aid of an appropriate transparent adhesive on the top side of the plastic body in the appropriately provided opening. In this case, when the lens is inserted into the opening, any cavity between the surface of the semiconductor sensor and the lens underside can simultaneously be filled with transparent adhesive such that the transparent plastic core can also be implemented in one operation with the mounting of the lens.

A method for producing a digital camera firstly requires provision of an injection mold that has at least one cavity for injection molding a plastic plate for a plurality of camera housings of a digital camera. The plastic plate also has suitable openings on its top side for holding a lens, and on its underside for holding a semiconductor sensor. These openings are implemented with the aid of one injection mold.

Thereafter, the underside of the plastic plate is fitted with semiconductor sensors, rewiring structures and external connections. Finally, the plastic core of the plastic body is filled up with transparent adhesive, and the top side of the plastic plate is simultaneously fitted with lenses in the openings provided therefor. As the lenses are being pressed into the openings provided therefor, the transparent adhesive is simultaneously distributed in the plastic core and pressed into all the angles and corners. If this mounting is not performed in a vacuum, it can be eased by providing ventilation openings.

Since in the case of this method the plastic body does not consist of a nontransparent plastic body, but of a molding compound such as can also be used for packing electronic assemblies, a lightsafe mask is provided while leaving the lens free on the top side of the plastic plate in order to avoid scattered light in the region of the mounting opening for the lens. After this lightsafe mask has been mounted on the top side of the plastic plate, the plastic plate can be separated into individual digital cameras. Because of the opaqueness of the plastic body to light, after the separation of the digital camera from the plastic plate the latter is immediately functional. Furthermore, this method has the advantage that the functionality of the cameras can also be tested before the separation of the plastic plate.

In a preferred exemplary embodiment of the method, the fitting of the underside of the plastic plate with semiconductor sensors that have external contact bumps is performed in the openings provided therefor by means of flip-chip technology. In this variant of the method, the semiconductor sensor already in practice bears the external connections on its underside, thus permitting a simple final mounting.

A further exemplary embodiment of the method provides that a frustoconical plastic core inside the plastic body is filled up with transparent plastic in a vacuum. This method has the advantage that no ventilation openings need be provided in the plastic body, which simultaneously forms the camera housing, since all the cavities in the core region of the camera can be filled up with transparent plastic without any problem in a vacuum.

An alternative method for producing a digital camera provides that a lead frame is provided for a plurality of semiconductor sensors and with flat conductors for external connections. In this method, the semiconductor sensors are mounted on the lead frame, and the contact surfaces on the top side of the semiconductor sensor are interconnected with the external connections by appropriate connecting wires or connecting lines. After this operation, the lead frame is potted with a transparent plastic to form a transparent lower plastic plate half while embedding the lead frame, the external connections and the connections on the underside of the plastic plate.

Subsequently, a selective coating of the top side of this lower plastic plate half with an aperture plate layer can be performed. In this case, an aperture plate is respectively aligned with the sensor surface of the semiconductor sensor. After the selective coating of the top side, such that an aperture plate is situated above each sensor surface, the further plastic plate half is mounted on this aperture plate layer. During this mounting, a transparent dome-shaped protuberance can simultaneously be molded on the top side of the plastic plate half. Alternatively, laser removal or sputtering can be used to mold corresponding dome-shaped protuberances which can serve as the lens surface on the top side of the top plastic plate half.

After the forming of the top plastic plate half with integrally installed lenses, the entire transparent plastic plate can be separated into individual camera housings with an installed integral lens and an installed semiconductor sensor as well as external connections. After the separation, the camera housing is transparent, and so scattered light can fall onto the sensor surface, a noisy image being produced thereby. The imaging does not become more perfect until after such a transparent digital camera is installed in a light-tight mount. A further variant of the method consists in protecting the transparent camera body against scattered light by shrinking on a lightsafe film while leaving free an opening for the lens on the outsides of the transparent digital camera.

The compact assembly of a sensor chip and of a package results in a miniaturized camera unit that can be used chiefly in the field of communications. For this purpose, the dimensions are kept to a minimum so as to facilitate use in mobile telephones, in laptops and cordless telephone apparatuses etc. Because of the rational production methods in the form of large-area plates, the camera according to the invention can be produced cost-effectively. Finally, because of the unity of packing and lens, direct application to a printed circuit board is possible, it being possible to use standard processing methods for processing the camera according to the invention. The number of input and output connections in the lateral region or bottom region of the camera according to the invention can be adapted to the application by means of flexible packing dimensions. It is also possible to apply a flip-chip technology that renders wiring in and on the housing dispensable and makes no use of any sort of open contacts during production.

The lens can either be injected as an individual piece, or be supplied for the purpose of being mounted on the molding in a matrix. This matrix is mounted onto the camera body and the camera body can thereafter be covered in a light-tight fashion. Furthermore, a very accurate positioning of lens, aperture and semiconductor sensor can be achieved, given the provision of halving the housing. The aperture is integrated in the camera body and thus protected against damage and maladjustment. The camera body can be produced as an array by means of molding. In one embodiment of the invention, the sensor chip is mounted by means of flip-chip bonding onto the contacts of the camera body. After the mounting of the semiconductor sensor, the array can be separated into individual cameras, for example by sawing.

Other features which are considered as characteristic for the invention are set forth in the appended claims.

Although the invention is illustrated and described herein as embodied in a digital camera with a light-sensitive sensor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 9 is a schematic cross section of a lower transparent plastic plate half with a plurality of digital cameras;

FIG. 10 is a schematic cross section of the mounting of an aperture plate layer onto the lower transparent plastic plate half;

FIG. 11 is a schematic cross section of the mounting of a second transparent plastic plate half with molded lenses on the top side of the upper plastic plate half;

FIG. 12 is a schematic cross-sectional view of FIG. 11 after the carrier substrate has been etched away;

FIG. 13 is a schematic cross section of a transparent digital camera element that has been separated out.

DESCRIPTION OF THE PREFERRED EMBODIMENTS

Figure 1:
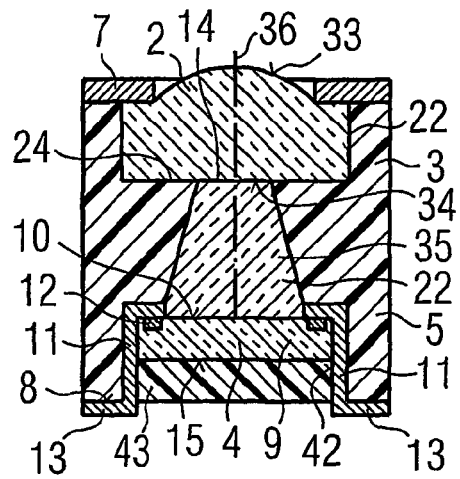
FIG. 1 is a schematic cross section of a first embodiment of the invention.

Referring now to the figures of the drawing in detail and first, particularly, to FIG. 1 thereof, there is shown a cross section of a first embodiment of the invention. This embodiment is virtually divided into three parts. There is shown a digital camera 1 with a lens 2 on the top side of the camera, a camera housing 3 and a light-sensitive sensor 4 on the bottom of the camera housing. The lens 2 has a front side or a lens top side 33, and a lens underside 34. The lens 2 is recessed into the camera housing 3 made from an optically opaque plastic body 5 and is connected mechanically to this plastic body via an adhesive 22. This adhesive 22 is a transparent adhesive that also fills the plastic core 35 of the plastic body 5 between the lens underside 34 and top side 10 of the semiconductor 9. This transparent plastic core 35 produces the number of light-refracting surfaces of the camera to the front side of the lens 2 or the lens top side 33, and to the top side 10 of the semiconductor sensor 9. Since the top side 10 of the semiconductor sensor 9 is arranged in a plane-parallel fashion relative to the underside 34 of the lens 2, the top side of the semiconductor sensor is coated only with an antireflection layer, in order to reduce the degree of reflection and to damp multiple reflections.

The semiconductor sensor in the embodiment of FIG. 1 has on its top side 10 a matrix of light-sensitive cells whose electrodes are connected via integrated circuits to contact surfaces 12 at the edge of the top side 10 of the semiconductor sensor 9. These contact surfaces 12 are supplied with current from outside the camera via contact connections 13, or supply the external contact connections 13 of the camera via a rewiring structure 11 in the cutout 42 in the bottom region of the plastic body 5 with serial signals of the image picked up by the surface 10 of the semiconductor sensor 9.

In the embodiment of FIG. 1, the external contacts 13 are arranged on the underside 8 of the plastic body 5, and the underside 15 of the semiconductor sensor 9 is protected against damage by a protective layer 43. A circular aperture 14 is arranged between the lens underside and the top side 10 of the semiconductor sensor 9 in the transparent plastic core 35, and constricts the beam path of the light such that scattered light is masked out of the top side 10 of the semiconductor sensor 9. In this embodiment of FIG. 1, the plastic body 5 made from light-absorbing material surrounds a frustoconical transparent plastic core 35 at the center 36 of the digital camera 1. The distance of the aperture 14 designed as an aperture plate from the lens top side 33 is in the range between a half and a third of the distance between the lens top side 33 and the top side 10 of the semiconductor sensor 9. The f-number lens 2 is set in this embodiment at 1:2.5 in conjunction with an objective field of 20 degrees. The focal length of the lens in this embodiment is 1.3 mm, and the aperture has a diameter of 0.29 mm, while the imaging surface or light-sensitive sensor surface has a diameter of 0.45 mm. The aperture is arranged at a distance from the lens top side 33 in a range from 0.5 to 0.9 mm, and the top side 10 of the semiconductor sensor 9 is positioned at a distance of between 1.5 and 2.7 mm from the lens top side 33. The transparent plastic used here has polycarbonate with a refractive index of 1.59. However, it is also possible to use a plastic material made from PMMA (polymethylmethacrylate), which has a refractive index of 1.49.

The front side of the lens can be designed as an aspheric surface, in order to minimize marginal distortions, but, given the small focal length and the small dimensions of the digital camera made from plastic, no substantial improvement is to be seen by comparison with a spherically shaped lens top side 33. The top side of the digital camera of the embodiment of FIG. 1 is fitted on its top side with a lightsafe mask 7 that surrounds the lens 2 completely in order to shield scattered light and to keep free only the cambered front side of the lens. This opening acts simultaneously as an additional aperture in the optical beam path.

Figure 2:
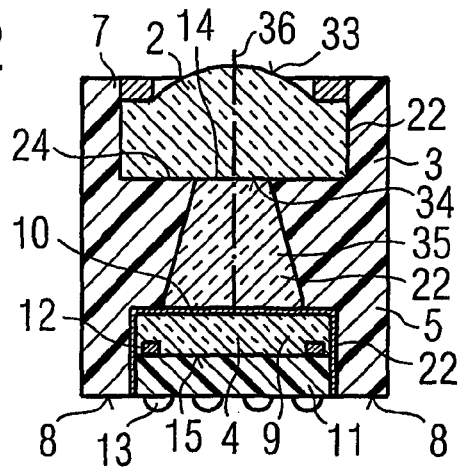
FIG. 2 is a schematic cross section of a second embodiment of the invention.

FIG. 2 shows a schematic cross section of a further embodiment of the invention. Components of FIG. 2 that have the same functions as components of FIG. 1 are marked with the same reference numerals and not additionally explained.

The essential difference between the embodiments of FIG. 1 and FIG. 2 consists in that the semiconductor sensor has on its underside 15 a rewiring structure 11 that is connected to the contact surfaces in the edge region of the top side 10 of the semiconductor sensor 9. Such a connection can be provided by means of through-plated holes through the semiconductor chip of the semiconductor sensor.

The underside of the rewiring structure 11 bears as external connections 13 contact bumps that are soldered on contact connection surfaces of the rewiring structure. Consequently, the semiconductor sensor 9 can be supplied via the contact bumps, and signals can be guided from the contact surfaces 12 of the semiconductor sensor 9 to the contact bumps and be tapped in serial form from the latter. The remaining design of the embodiment of FIG. 2 corresponds to the design of FIG. 1. Here, as well, the optical beam path inside the digital camera is produced continuously from transparent plastic without an additional refracting surface.

Figure 3:
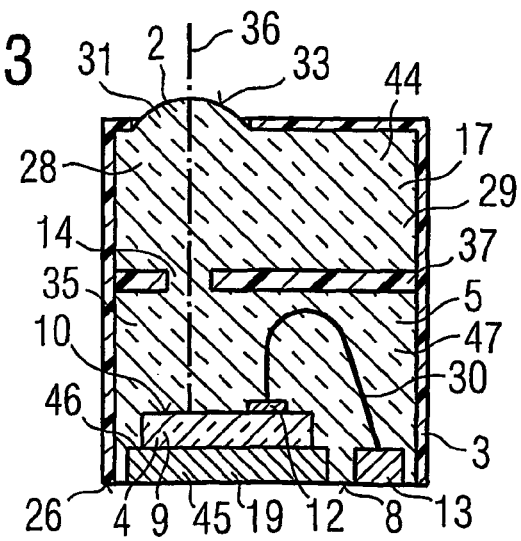
FIG. 3 is a schematic cross section of a third embodiment of the invention.

FIG. 3 shows a schematic cross section of a third embodiment of the invention. Components that fulfill the same functions as in FIGS. 1 and 2 are marked with the same reference numerals and not additionally explained.

The embodiment of FIG. 3 differs from the embodiments of FIGS. 1 and 2 in that the electronic camera consists of a homogeneous block made from transparent plastic. This block has on its top side a protuberance 31 that is designed as a lens top side 33 and is shaped either aspherically or spherically. Between half the distance from the lens top side to the top side 10 of the semiconductor sensor 9 and a third of this distance, the transparent plastic block has an aperture plate 37 that has an aperture 14 at the center 36 of the beam path of the electronic camera 1. Multiple reflections and scattered light are reduced with the aid of this aperture 14. The center 36 of the electronic camera simultaneously constitutes the optical axis. The transparent plastic block 44 can have on its underside a semiconductor sensor 9 with a rewiring structure 11, as in the previous embodiments of FIGS. 1 and 2. However, in this embodiment the rewiring structure is formed on a lead frame 19. This lead frame 19 bears, on the one hand, the semiconductor sensor 9 on a contact plate 45, which can serve simultaneously with its underside as one of the external connections when the semiconductor sensor 9 is mounted on the contact plate 45 with the aid of a conductive adhesive layer 46.

Arranged in addition to the contact plate 45 for the semiconductor sensor 9 are external connecting elements 13 that are potted into the transparent plastic molding compound 47 of the plastic block 44 in a fashion insulated from the contact plate 45. The external connections 13 are connected via bonding wires 30 to the contact surfaces 12 on the semiconductor sensor 9. The transparent plastic block 44 of this embodiment of the invention can be protected against scattered light by being installed in an appropriate opaque mount. In this embodiment of FIG. 3, a thin opaque shrink film is shrunk as housing 3 onto the transparent plastic block without affecting the opening for the lens 2 and without affecting the external connections 13.

Figure 4:
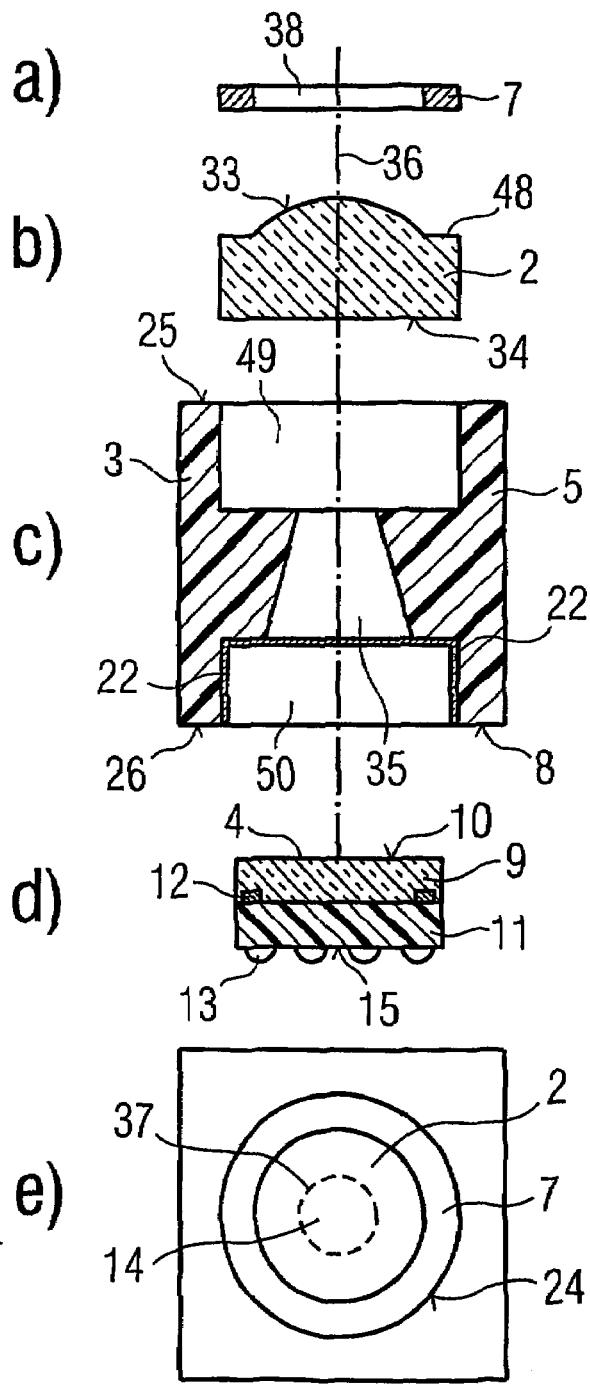
FIG. 4 is a schematic method sequence for producing the second embodiment of the invention.

FIG. 4 shows in sub FIGS. 4a) to 4e) schematic method steps and components for producing the second embodiment of the invention as is shown in FIG. 2.

Firstly, FIG. 4a shows a lightsafe film 7 that is produced from opaque plastic and has circular openings 38 that are adapted to the protuberance of the lens.

FIG. 4b shows a lens 2 that is shaped from a transparent plastic and has a disk-shaped edge shoulder 48 that is arranged in a plane-parallel fashion relative to the lens underside 34. The focal length of this lens is 1.3 mm in this embodiment, the lens being produced from PMMA. This material has a refractive index of 1.49, and can be mounted in an opening provided therefor with the aid of optical UV cement. The refractive index of this optical UV cement is adapted to the transparent lens plastic.

FIG. 4c shows a plastic body 5 that is produced from opaque plastic material and has on its top side an opening 49 that is adapted to the lens 2 shown in FIG. 4b. The plastic body 5 is constricted at the underside of the lens 34 and forms therewith an aperture 14 for the digital camera. Arranged on the underside 8 of the plastic body 5 is an opening 50 of the plastic body 5 that serves for holding a semiconductor sensor. Arranged between the two openings 50 and 49 on the underside 8 and the top side of the plastic body 5 is a frustoconical region that is filled up with a transparent plastic adhesive during mounting of the digital camera 1 such that the entire beam path is guided in the digital camera 1 through a transparent plastic.

The plastic body illustrated in FIG. 4c is separated out of a plastic plate that has a multiplicity of plastic bodies 5 for digital cameras 1. This plate with a thickness of between 2 and 3 mm can be produced by means of an injection molding method in a bipartite mold whose cavities are designed such that they automatically produce the openings 49 and 50 and the frustoconical connection for a transparent plastic core 35 upon injection of the opaque plastic.

FIG. 4d shows a semiconductor sensor that bears on its underside a rewiring structure 11 with external connections 13 in the form of contact bumps that are soldered onto corresponding contact connection surfaces of the rewiring film. A multiplicity of such semiconductor sensors 9 can be produced using silicon planar technology on a silicon wafer that is subsequently separated to form semiconductor sensors and is provided with an appropriate rewiring structure.

FIG. 4e shows a plan view of the assembled digital camera. This requires merely that the components of FIGS. 4a to 4d be bonded to one another via an optical UV cement. However, this mounting can also be performed directly after the injection molding of a multiplicity of plastic bodies 5 in a plastic plate.

Figure 5:
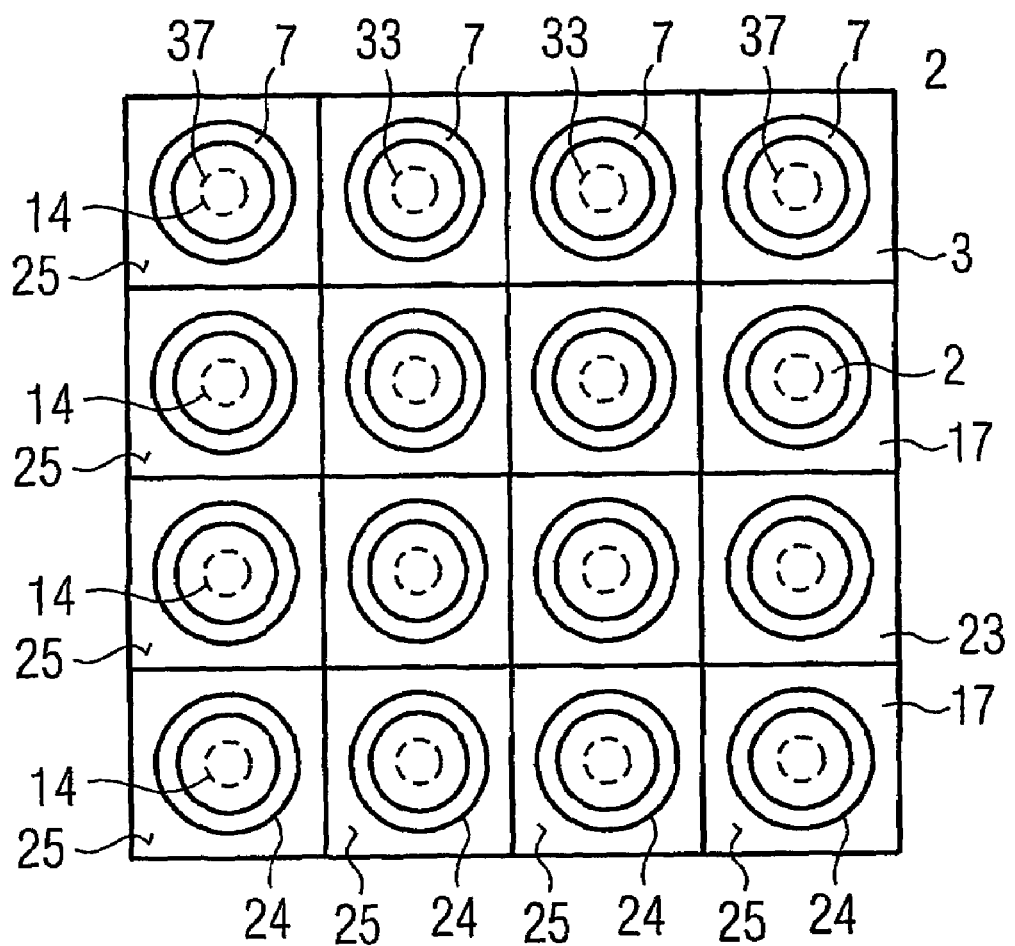
FIG. 5 is a schematic plan view of a plate-shaped assembly of a plurality of lenses for digital cameras of one embodiment of the present invention.

FIG. 5 shows schematically a plan view of a plate-shaped arrangement of a plurality of lenses 2 for digital cameras of one embodiment of the present invention. In this embodiment, corresponding openings 24 are introduced simultaneously into a plastic plate for a plurality of digital cameras, and these openings 24 are fitted with the individual components, as shown in FIG. 4. Only thereafter is the plate then separated to form individual digital cameras, for example by means of a sawing technique. In this case, a plurality of method steps are carried out one after another.

The first step is to provide an injection mold that has at least one cavity for injection molding a plastic plate 23 for a plurality of camera housings 3 of a digital camera 1. For this purpose, the plastic plate 23 has suitable openings on its top side 25 for holding lenses 2, and on its underside for holding a semiconductor sensor. This plastic plate 23 is firstly fitted on its underside with semiconductor sensors that bear a rewiring structure and external connections. Thereafter, the plastic core of the plastic body is filled up with transparent adhesive such as an optical UV cement that can be cured by UV. Finally, lenses 2 are inserted from the top side 25 into the openings provided therefor. Finally, in order to finish the plastic plate with a plurality of digital cameras, a lightsafe mask can be mounted on the top side 25 of the plastic plate 23 while leaving each lens free.

Mounting the lightsafe mask 7 can also be performed by a plurality of disk-shaped lightsafe masks on each of the digital cameras of the plastic plate 23. Finally, the plastic plate 23 is separated into individual digital cameras.

FIGS. 6 to 14 show the production of an electronic camera as shown in FIG. 3.

Figure 6:
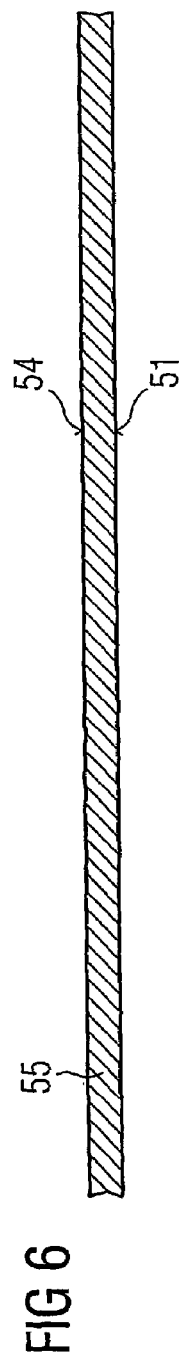
FIG. 6 is a schematic cross section of a carrier substrate on which a lead frame can be electrodeposited.

FIG. 6 shows a schematic cross section of a carrier substrate 55 on which a lead frame can be electrodeposited. This carrier substrate 55 is therefore made from a metal, preferably from a copper alloy that has a good electric conductivity in the plating bath. The underside 51 of the carrier substrate 55 is completely covered with an organic insulating layer, while the top side 52 of the carrier substrate is covered with a selectively structured organic cover layer. This selectively structured cover layer (not shown) leaves the top side 52 free at the points at which material is to be electrodeposited for a lead frame.

Figure 7:
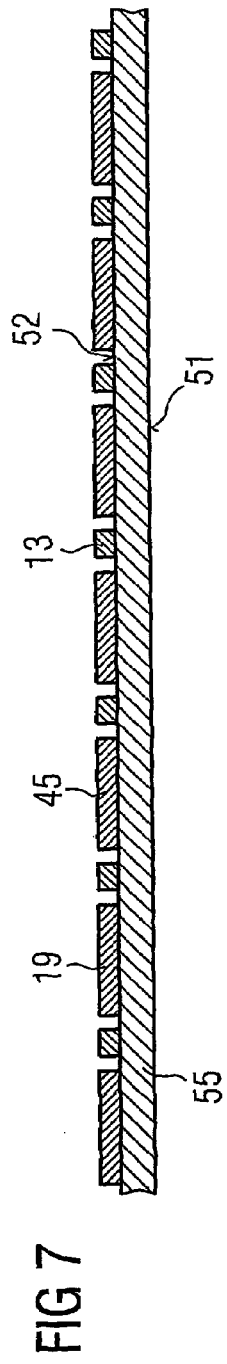
FIG. 7 is a schematic cross section of a carrier substrate, and components of a lead frame deposited thereon.

FIG. 7 shows a schematic cross section of a carrier substrate 55 with components, deposited thereon, of a lead frame 19. These components essentially consist of a contact plate 45 for each digital camera and a corresponding number of external connections 13. These components can be deposited in the plating bath, for example as a nickel alloy, on the top side 52 of the carrier substrate 55. In order to finish the surface 56 with a bondable coating, noble metals such as gold or silver or else aluminum can be deposited on this surface 56. In this case, it is possible by overgrowing the surface 56 with this coating simultaneously to achieve an overlap of the coating over the edges of the lead frame structures provided, such that the contact plate 45 and the external connections 13 can be positively anchored in the transparent plastic block of the digital camera.

Figure 8:
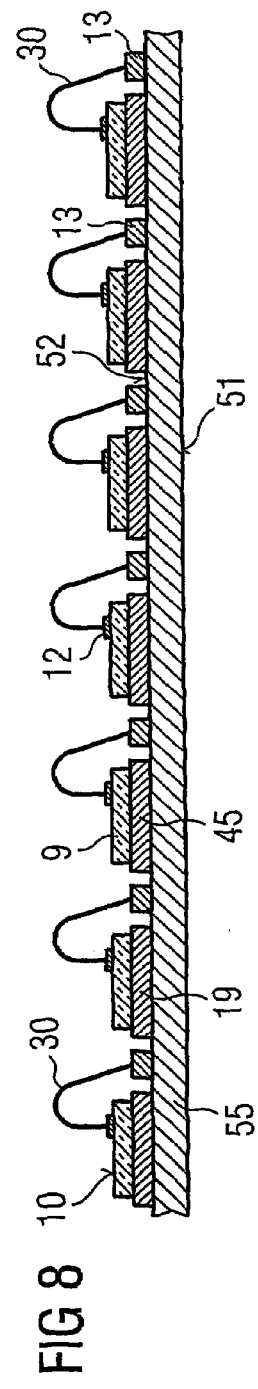
FIG. 8 is a schematic cross section of a lead frame with semiconductor sensors arranged thereon and bonding wire connections to external connections.

FIG. 8 shows a schematic cross section of a lead frame 19 with semiconductor sensor 9 arranged thereon and bonding wire connections 30 to the external connections 13. For this purpose, a semiconductor sensor, for example made from silicon, is mounted on each contact plate 45, initially with a conductive adhesive or by being alloyed in thermally. Thereafter, a bonding method can be used to bond a line wire onto the contact surfaces 12 on the top side of the semiconductor sensor 9, and to connect it to the external connections 13.

FIG. 9 shows a schematic cross section of a lower transparent plastic plate half 39 for a plurality of digital cameras. This plastic plate half 39 can be produced by injection molding on the carrier substrate such that the entire lead frame 19 with the semiconductor sensors 9 and the external connections 13 as well as the connections 30 are embedded in transparent plastic by means of an injection molding method. An aperture plate is mounted in a subsequent step onto this lower transparent plastic plate half 39.

FIG. 10 shows a schematic cross section of the mounting of an aperture plate layer 41 onto the lower transparent plastic plate half 39. In this case, the apertures 14 of the aperture plate layer 41 are aligned with the centers 36 of the digital camera. This aperture plate coating can be performed by mounting an opaque plastic that is either subsequently structured by means of a photolithographic technique or is mounted by means of a mask such that the aperture plate openings are kept free in this case from opaque plastic.

FIG. 11 shows a schematic cross section of the mounting of an upper transparent plastic plate half 40 onto the aperture plate layer 41, the upper transparent plastic plate half 40 having integrally formed lenses 2 on the top side of the upper transparent plastic plate half 40. This mounting can also be performed by a single injection molding operation so as to produce for a multiplicity of digital cameras a block made from homogeneous transparent plastic that has an integral lens 2 in the form of protuberances 31 on the top side of the mounted transparent plastic plate half 40. The entire structure is further held together and borne in FIG. 11 by the carrier substrate 55.

FIG. 12 shows a schematic cross-sectional view of FIG. 11 after the carrier substrate 55 has been etched away. The etching away of the carrier substrate 55 is facilitated by virtue of the fact that, on the one hand, there is a material difference between the carrier substrate 55 and the metal of the lead frame 19 such that the etching-away operation of the carrier substrate 55 is stopped to the greatest possible extent at the boundary surface of the carrier substrate. After the separation of the carrier substrate 55, the transparent plastic plate 23 can be separated to form individual transparent digital cameras 56.

FIG. 13 shows a transparent digital camera 56 separated out of the transparent plastic plate 23 of FIG. 12. Components that have the same functions as in the preceding figures are marked with the same reference numerals and not additionally explained. This transparent digital camera 56 has the disadvantage that it captures so much scattered light via its transparent sides and surfaces that the image would be completely noisy. However, this transparent electronic camera 56 made from a transparent plastic block 44 can be inserted into an opaque mount of a device without providing the transparent lateral surfaces in advance with protection by means of an opaque layer or of an opaque special housing.

Figure 14:
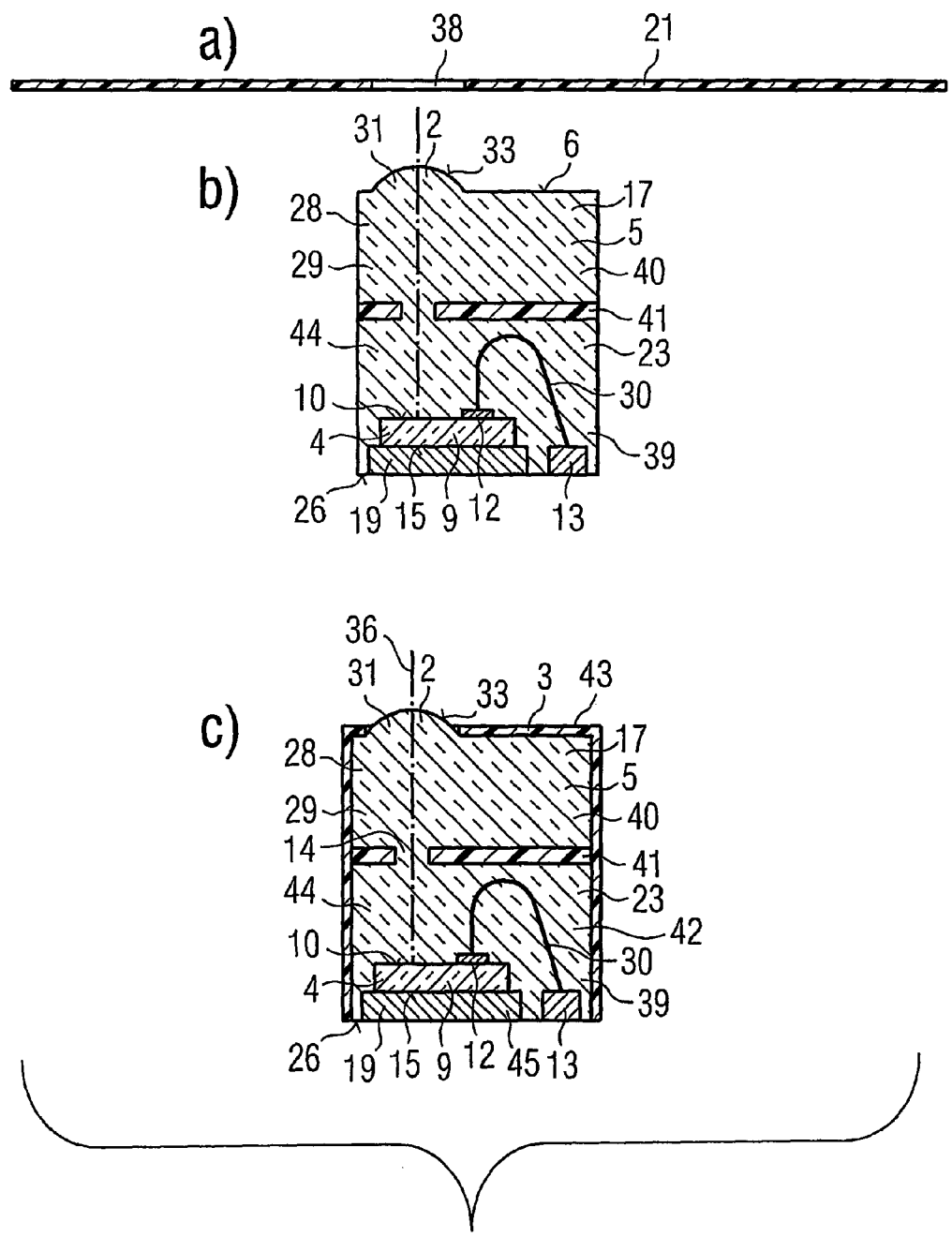
FIG. 14 is a schematic cross section of the production steps for a transparent digital camera of the embodiment of FIG. 3.

FIG. 14 shows in the sub FIGS. 14a) to 14c) production steps in schematic cross sections of a transparent digital camera 1 of the embodiment according to FIG. 3.

Demonstrated schematically in cross section in FIG. 14a is a shrink film 21 that has an opening 38 that corresponds to the size and the circumference of a lens 2 of the transparent electronic camera 56, as is shown in FIG. 13.

FIG. 14b shows a transparent camera aligned with the opening 38 in FIG. 14a, as is known from FIGS. 3 and 13. Components with the same functions as in the preceding figures are marked with the same reference numerals and not additionally explained. By heating the shrink film 21 shown in FIG. 14a after the shrink film is laid onto the top side 6 of the plastic body, the shrink film 21 is heated and clings as opaque housing to the surfaces of the transparent plastic block 44 of the transparent digital camera 56.

FIG. 14c shows the result of this method step, which essentially shows a digital camera of the third embodiment, as shown in FIG. 3, of the present invention, in a schematic cross section. Here, the transparent plastic is either a PMMA or a polycarbonate, and the focal length of the lens is set to 1.3 mm in this embodiment. The opening is set to 1:2.5 in the case of an object field of 20°, and the aperture stop has an opening with a diameter of between 0.25 mm and 0.45 mm, while the active area of the semiconductor sensor 9 has a diameter of 0.40 mm to 0.9 mm. In this embodiment of the invention, the aperture stop is incorporated at a distance of 0.5 to 0.9 mm from the front side of the lens, and the distance between the top side of the lens and the top side 10 of the semiconductor sensor 9 is between 1.5 mm and 3 mm in this embodiment.

The lead frame 19 with the contact plate 45 and the external connections 13 is made in this embodiment from a nickel alloy, while the bonding wire 30 is produced from a gold or aluminum wire. The semiconductor sensor 9 with its integrated circuits consists of a planar silicon chip, while the aperture plate layer 41 consists of a transparent plastic, filled with a light-absorbing powder, of the same type as the transparent plastic block 44 of the digital camera. The lens can be spherically curved, or else be deformed in a weakly aspherically elliptical fashion with a conical section constant k=−0.2. Objective fields of between 20 and 30° in conjunction with a pixel density of 128×128 with a pixel size of 2.5 μm and an image diagonal of 0.45 mm are possible with this digital camera. An image diagonal of 0.9 mm is provided with a semiconductor sensor with a pixel surface of 256×256 pixels in conjunction with a pixel size of 2.5 μm. The aperture or field angle of 20 to 30° in each case is already associated with a slight telephoto effect for photographs of people. It is true that the design for the housing and semiconductor sensor becomes more cost-effective the greater the extent to which the housing of the camera is minimized, but there is a simultaneous diminution in image quality.

We claim:

1. A digital camera, comprising:
   a lens having a lens top side and a lens underside;
   a camera housing;
   a light-sensitive semiconductor sensor having a top side aligned with said lens and an underside;
   said camera housing having a plastic body with a top side carrying said lens and an underside with said light-sensitive sensor;
   a transparent plastic core filling an interspace between said lens underside and said top side of said semiconductor sensor, wherein the entire space between said lens underside and said top side of said semiconductor sensor is filled by said transparent plastic core; and
   wherein a circular aperture is formed between said lens underside and said top side of said semiconductor sensor in said transparent plastic core.

2. The digital camera according to claim 1, wherein said camera housing has an underside with a rewiring structure and external connections, and said semiconductor sensor is formed, on said top side thereof, with a matrix of light-sensitive cells having electrodes connected via integrated circuits to contact surfaces cooperating with said rewiring structure and said external connections.

3. The digital camera according to claim 1, wherein said plastic body is formed with optically transparent material.

4. The digital camera according to claim 1, wherein said aperture is defined by an aperture plate disposed at a spacing distance from said lens top side, said spacing distance is between one half and one third of a distance between said lens top side and said top side of said semiconductor sensor.

5. The digital camera according to claim 1, wherein said rewiring structure is disposed on said underside of said plastic body.

6. The digital camera according to claim 1, wherein said rewiring structure is disposed on said underside of said semiconductor sensor.

7. The digital camera according to claim 1, wherein said rewiring structure is a lead frame, and said semiconductor sensor is mounted on said lead frame.

8. The digital camera according to claim 7, wherein said semiconductor sensor is adhesively mounted on said lead frame.

9. The digital camera according to claim 8, which comprises an amount of conductive adhesive mounting said semiconductor sensor on said lead frame.

10. The digital camera according to claim 1, which comprises a lightsate mask surrounding said lens.

11. The digital camera according to claim 1, wherein said rewiring structure has conductor tracks connecting said contact surfaces of said semiconductor sensor to external connections on said underside of said housing of the digital camera.

12. The digital camera according to claim 1, wherein said external connection comprises contact bumps.

13. The digital camera according to claim 12, wherein said contact bumps are formed of soldering material on said underside of said semiconductor sensor.

14. The digital camera according to claim 12, wherein said external contact bumps include soldering material.

15. The digital camera according to claim 1, which comprises a lead frame forming a rewiring structure of the digital camera, said lead frame carrying said semiconductor sensor and having external electric connections, and said semiconductor sensor having contact surfaces connected to said external connections via bond wires.

16. The digital camera according to claim 1, wherein said plastic body and said lens are integrally formed as a single piece of a common plastic body of transparent plastic.

17. The digital camera according to claim 16, wherein said transparent plastic body is covered by a lightsafe film, leaving free an opening for said lens.

18. The digital camera according to claim 17, wherein said lightsafe film is a shrink film.

19. The digital camera according to claim 1, wherein said semiconductor sensor is adhesively mounted on said underside of said plastic body with an adhesive.

20. The digital camera according to claim 1, wherein said lens is adhesively mounted on said plastic body with an adhesive.

21. A method for producing digital cameras, which comprises the following method steps:
providing an injection mold with at least one cavity for injection-molding a plastic plate for a plurality of camera housings, the plastic plate having a top side formed with openings for holding respective lenses, and an underside for holding semiconductor sensors;
fitting the underside of the plastic plate with semiconductor sensors, rewiring structures, and external connections;
filling plastic cores respectively defined between the semiconductor sensors and the openings for the lenses with transparent adhesive;
fitting the openings on the top side of the plastic plate with lenses;
mounting a lightsafe mask, leaving free each lens on the top side of the plastic plate; and
separating the plastic plate into individual digital cameras each according to claim 1.

22. The method according to claim 21, wherein the step of fitting the underside of the plastic plate comprises mounting semiconductor sensors with external contact bumps in openings provided therefor by way of flip-chip technology.

23. The method according to claim 21, wherein the filling step comprises forming a frustoconical plastic core under a vacum.

24. A digital camera, comprising:
a lens having a lens top side and a lens underside;
a camera housing;
a light-sensitive semiconductor sensor having a top side aligned with said lens and an underside;
said camera housing having a plastic body with a top side carrying said lens and an underside with said light-sensitive sensor;
said plastic body being formed of a light-absorbing material;
a transparent plastic core filling an interspace between said lens underside and said top side of said semiconductor sensor;
said plastic core beinq a frustoconical transparent plastic core;
said plastic body surrounding said frustoconical transparent plastic core at a center thereof; and
wherein a circular aperture is formed between said lens underside and said top side of said semiconductor sensor in said frustoconical transparent plastic core.

* * * * *